(12) United States Patent
Toma et al.

(10) Patent No.: US 12,704,690 B2
(45) Date of Patent: Aug. 11, 2026

(54) HIGH SPEED OPTICAL LINKS FOR HIGH-BANDWIDTH MEMORY SYSTEMS

(71) Applicant: Google LLC, Mountain View, CA (US)

(72) Inventors: Horia Alexandru Toma, Sunnyvale, CA (US); Zuowei Shen, Los Altos, CA (US); Ilyas Mohammed, San Jose, CA (US); Yingying Wang, Sunnyvale, CA (US); William F. Edwards, Jr., Livermore, CA (US)

(73) Assignee: Google LLC, Mountain View, CA (US)

( * ) Notice: Subject to any disclaimer, the term of this patent is extended or adjusted under 35 U.S.C. 154(b) by 302 days.

(21) Appl. No.: 18/372,989

(22) Filed: Sep. 26, 2023

(65) Prior Publication Data

US 2025/0102746 A1 Mar. 27, 2025

(51) Int. Cl.

| | |
|---|---|
| ***H04B 10/00*** | (2013.01) |
| ***G02B 6/42*** | (2006.01) |
| ***H10B 80/00*** | (2023.01) |

(52) U.S. Cl.

CPC ......... *G02B 6/4268* (2013.01); *G02B 6/4204* (2013.01); *G02B 6/4249* (2013.01); *H10B 80/00* (2023.02)

(58) Field of Classification Search

CPC .. G02B 6/4268; G02B 6/4204; G02B 6/4249; H10B 80/00; G11C 7/1054; G11C 7/1081; G11C 7/04; G11C 5/02; G11C 5/025; H01L 25/0655; H01L 25/105; H01L 2225/06534; H01L 25/18; H01L 2225/06589; H01L 2225/1094; H01L 23/34; H01L 25/0657; H01L 25/16

See application file for complete search history.

(56) References Cited

U.S. PATENT DOCUMENTS

| | | | | |
|---|---|---|---|---|
| 11,456,523 | B2 * | 9/2022 | Liu | H01L 23/481 |
| 11,688,665 | B2 * | 6/2023 | Eid | H01L 23/473 257/713 |
| 2007/0194425 | A1 * | 8/2007 | Zingher | H01L 23/50 257/E23.079 |
| 2015/0370015 | A1 * | 12/2015 | Aoki | G02B 6/423 385/14 |
| 2017/0243806 | A1 * | 8/2017 | Iyengar | H01L 23/498 |
| 2019/0086618 | A1 * | 3/2019 | Shastri | H01R 12/721 |
| 2020/0192035 | A1 * | 6/2020 | Leigh | G02B 6/4415 |
| 2021/0028534 | A1 * | 1/2021 | Liu | H01L 23/66 |

(Continued)

FOREIGN PATENT DOCUMENTS

CN 115985900 A 4/2023

OTHER PUBLICATIONS

Extended European Search Report for European Patent Application No. 24202832.2 dated Feb. 11, 2025. 10 pages.

*Primary Examiner* — Agustin Bello

(74) *Attorney, Agent, or Firm* — Lerner David LLP

(57) ABSTRACT

The technology generally relates to high bandwidth memory (HBM) packages and processor packages that have optical connectivity. Disclosed systems and methods herein allow for HBM dies that are interconnected with an optical interface in a manner that allows for compact, high-performance computing. An HBM package can be cooled using a cooling unit that is distinct from the processor package. In addition, the cooling unit can be configured so as to provide thermal contact with a subset of high-power components within the HBM package.

20 Claims, 10 Drawing Sheets

(56) References Cited

U.S. PATENT DOCUMENTS

| | | | | |
|---|---|---|---|---|
| 2022/0239198 | A1* | 7/2022 | Dogruoz | H05K 7/20236 |
| 2022/0365583 | A1* | 11/2022 | Vijayrao | G11C 7/1054 |
| 2023/0308188 | A1* | 9/2023 | Dorta-Quinones | H04B 10/40 |
| 2024/0030065 | A1* | 1/2024 | Duan | H01L 21/76816 |
| 2024/0036278 | A1* | 2/2024 | Toma | H01L 23/473 |
| 2024/0038633 | A1* | 2/2024 | Haba | H01L 24/29 |
| 2024/0369783 | A1* | 11/2024 | Yu | G02B 6/4283 |
| 2024/0402442 | A1* | 12/2024 | Chiu | G02B 6/4249 |
| 2024/0421025 | A1* | 12/2024 | Du | H01L 23/3675 |
| 2025/0098062 | A1* | 3/2025 | Buchling Rego | H05K 1/0203 |
| 2025/0102746 | A1* | 3/2025 | Toma | G02B 6/4249 |
| 2025/0233042 | A1* | 7/2025 | Tong | H01L 23/5385 |
| 2025/0233045 | A1* | 7/2025 | Tong | H01L 25/072 |

* cited by examiner

300

500

700

800

HIGH SPEED OPTICAL LINKS FOR HIGH-BANDWIDTH MEMORY SYSTEMS

High performance computing can involve a plurality of high bandwidth memories ("HBMs"). As the performance requirements of packages increase, higher-powered and/or additional HBMs may be necessary to provide the bandwidth and capacity for the increased performance. However, the number of HBM dies integrated in a package may be limited due to space constraints of the package, power constraints of the package, and/or the thermal constraints of the package.

BRIEF SUMMARY

The technology generally relates to high bandwidth memory (HBM) packages that are optically connected to processor packages. Disclosed systems herein allow for HBM dies that are interconnected with an optical interface in a manner that allows for high performance computing. The optical interfaces of the HBM packages may be configured to connect the HBM package to one or more optical fibers that form an optical link with one or more packages.

In accordance with aspects of the disclosure, a system may comprise: a processor package comprising one or more processing units; and a high-bandwidth memory (HBM) package comprising a plurality of HBM assemblies and one or more cooling components, wherein each HBM assembly has a first region containing a first set of components and a second region containing a second set of components, wherein the first set of components are higher power components with respect to the second set of components and the second set of components includes an optical interface configured to communicate via one or more optical fibers with the processor package, and wherein the one or more cooling components are configured to transfer heat from the first set of components of the plurality of HBM assemblies.

In accordance with other aspects of the disclosure, the one or more cooling components may include a cold-plate that is configured to contact the first set of components of the plurality of HBM assemblies. The cold-plate can be configured so that it does not contact the second set of components of the plurality of HBM assemblies.

In still other aspects of the disclosure, the processor package may further comprise a cooling unit that is distinct from the one or more cooling components of the HBM package. The cooling unit may be configured to use a different type of medium for transferring heat than the one or more cooling components of the HBM package.

In still other aspects of the disclosure, the first set of components includes one or more HBM dies. In addition, each of the plurality of HBM assemblies may have a footprint within the HBM assembly and wherein the first region corresponds to a first portion of the footprint and the second region corresponds to a second portion of the footprint.

In yet other aspects of the disclosure, the plurality of HBM assemblies may have a first side and a second side that opposes the first side, and wherein the first set of components comprise a stack of HBM dies located at the first side of each HBM assembly and the optical interface is located at the second side of each HBM assembly. In addition, the plurality of HBM assemblies may be arranged to be in an array of at least two rows, or the plurality of HBM assemblies may be arranged to be in an array having more than two rows.

In other aspects of the disclosure, a processor package may comprise one or more processors; a memory package may comprise a plurality of HBM assemblies, wherein each HBM assembly comprises an HBM die and an optical interface; a thermal contact unit may have one or more thermally conductive surfaces, wherein the HBM die of each HBM assembly is configured to contact at least one of the thermally conductive surfaces, and wherein the optical interface of each HBM assembly does not contact the one or more surfaces; and one or more optical fibers may configured to optically connect the optical interface with one or more processing units.

In accordance with still other aspects of the disclosure, the one or more surfaces of the thermal contact unit may be defined by a cold-plate that is configured to contact each HBM die. The thermal contact unit may also be configured to apply a compression force between the one or more surfaces and the plurality of HBM assemblies. The thermal contact unit may apply the compression force via one or more spring-loaded connectors. The system may further comprise a substrate on which the plurality of HBM assemblies are arranged; and a connecting plate that is configured to connect with the one or more spring-loaded connectors, wherein the plurality of HBM assemblies are arranged on a first side of the substrate and the connecting plate is located on a second side of the substrate that opposes the first side.

In accordance with still other aspects of the disclosure, the processor package may further comprise a cooling unit that is distinct from the thermal contact unit of the HBM package. The cooling unit may be configured to use a different type of medium for transferring heat than the thermal contact unit. In addition, the plurality of HBM assemblies may have a first side and a second side that opposes the first side, and wherein the HBM die is located at the first side of each HBM assembly and the optical interface is located at the second side of each HBM assembly.

In accordance with yet other aspects of the disclosure, the plurality of HBM assemblies may be arranged to be in an array of at least two rows.

DETAILED DESCRIPTION

Disclosed systems and methods herein provide an optics module package that provides memory and computing units that are interconnected with one another via optical connections in a manner that allows for flexible cooling solutions while maintaining high performance computing. The systems disclosed herein can be implemented in connection with various applications, including machine learning, large-language models, and other forms of artificial intelligence processing.

Placing HBMs in close proximity improves bandwidth but is not always feasible given other design constraints, particularly in a datacenter environment. In a datacenter, different components for requirements like processing, memory, power, cooling, etc., may have different constraints or restrictions requiring particular components be used, and in particular locations within the datacenter. Aspects of the disclosure allow for a greater range of types and sizes of components directed to datacenter requirements, at least because components can be placed in different locations relative to one another, without sacrificing high performance computing because of an increased bottleneck due to reduced memory bandwidth.

The added flexibility in component placement, such as between compute and memory components, facilitates datacenter scaling, allowing a datacenter implementing aspects of the disclosure to be continually upgraded to match increasing computational demand for various workloads and applications. For example, large language models are particularly memory bandwidth bottlenecked and are often used in applications with strict latency requirements, such as a chatbot or natural language processing application in which a latency on the order of natural conversation pauses is needed. Components interconnected using an optics module package as described herein, such as components described with reference to FIGS. 9-10, can be added or upgraded more efficiently because a board or substrate-level hardwiring between the components is not used.

Figure 1:
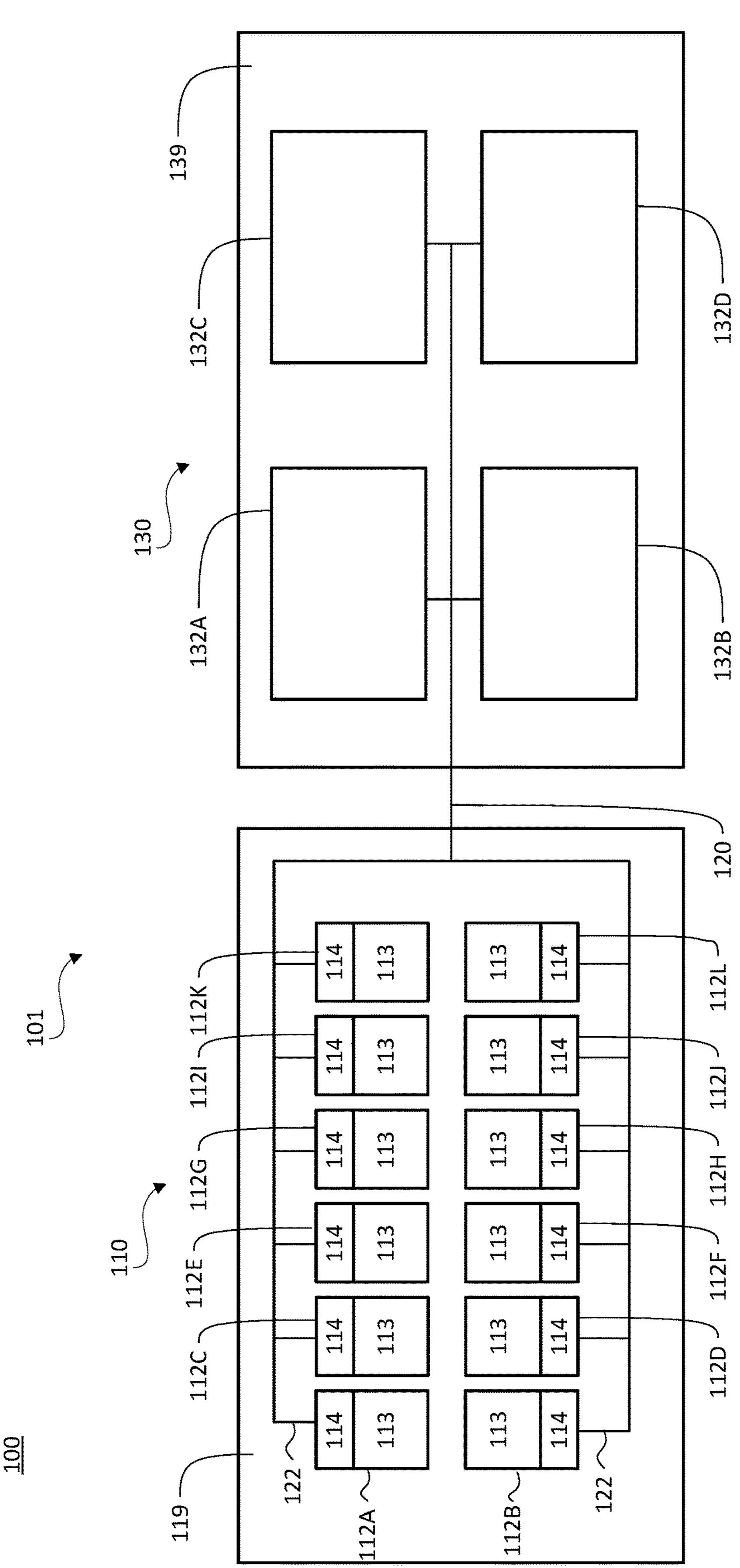
FIG. 1 is a block-diagram of an optical high-bandwidth memory system according to aspects of the disclosure.

FIG. 1 is a block diagram 100 of an example high-bandwidth memory (HBM) system 101 in which memories units and processing units, are disaggregated into different packages. For example, system 101 includes a memory package 110 and a processor package 130. Memory package 110 contains a plurality of HBM assemblies 112A-L that serve as memory for system 101, while processor package 130 contains a plurality of processing units 132A-D that perform processing operations for system 101. Memory package 110 is optically connected to processor package 130 via one or more optical connections, such as optical bundle 120. Optical bundle 120 may include a bundle of a plurality of optical fibers 122, and particular optical fibers 122 may be optically connected to one of the particular HBM assemblies 112A-L. Accordingly, optical signals may be transmitted between the HBM assemblies 112A-L and the processing units 132A-D via one or more optical bundles 120. Each HBM assembly may have a size configured to particular applications. For example, HBM assemblies 112A-L may each have a footprint on substrate 119 that is around 13 mm in length by 11 mm in width. Alternatively, HBM assemblies 112A-L may each have, for example, a footprint that is around 30 mm in length and 15 mm in width.

The processing units 132A-D may be any high-bandwidth processor such as ASICs, tensor processing units (TPUs), graphics processing units (GPUs), field-programmable gate arrays (FPGAs), or other high-bandwidth processing units (XPUs). The processing units 132A-D of processor package 130 are arranged on a substrate 139. Substrate 139 can be a motherboard for system 101 or it can be any suitable substrate that can be incorporated into system 101. For example, if system 101 is a part of a server, substrate 139 may be configured to be incorporated into a rack of the server.

Figure 2:
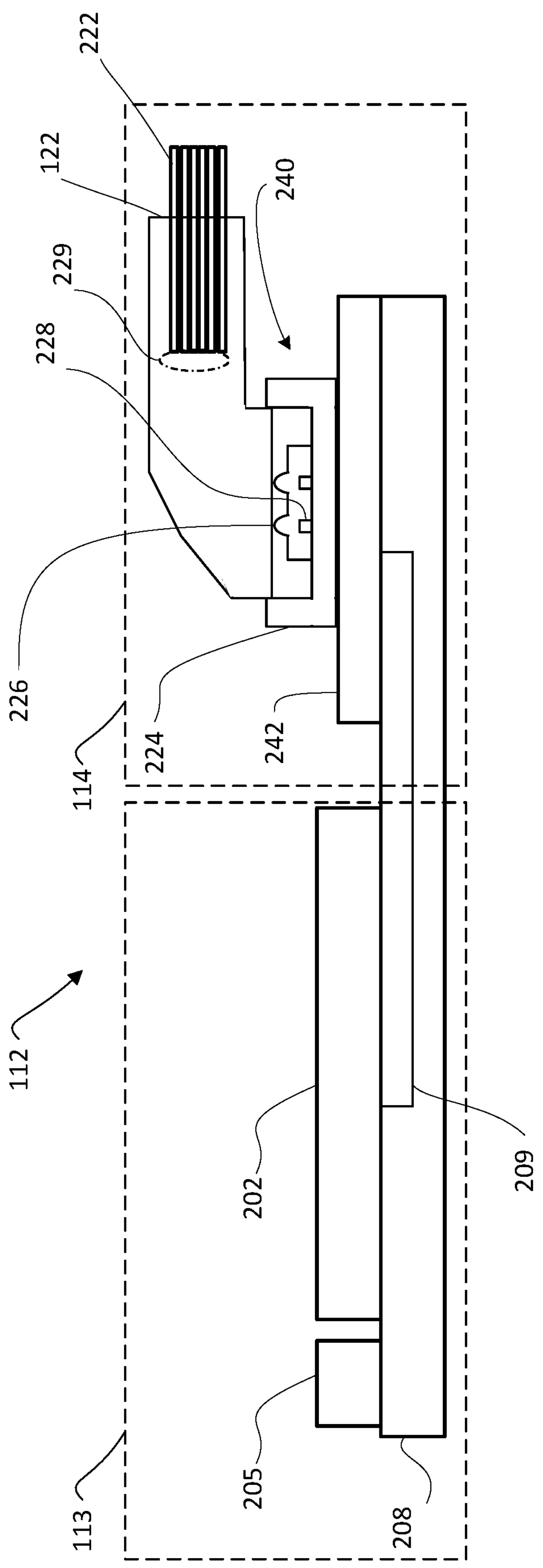
FIG. 2 is a cross-sectional side view of a high-bandwidth memory assembly according to aspects of the disclosure.

In accordance with aspects of the disclosure HBM assemblies 112A-L may be configured to have a high-power region 113 that contains components having a relatively high power dissipation relative to a low-power region 114. The high-power region 113 may contain one or more memory dies, while the low-power region 114 may contain optical connectivity components. For example, FIG. 2 provides a cross-sectional side view 200 of an HBM assembly 112. High-power region 113 of HBM assembly contains one or more HBM dies 202, as well as one or more power units 205. The one or more HBM dies 202 are configured to store data and perform read and write operations in connection with the stored data. The one or more power components 205 are configured to provide power to the HBM assembly 112. Components of high-power region 113 and low-power region 114 may each be connected to HBM assembly substrate 208, which contains electrical connections 209. HBM die 202 may transmit and receive electrical signals with silicon converter 242 via an electrical connection 209, with silicon converter 242 being configured to convert between electrical and optical signals. For example, if memory die 202 is performing a read operation, memory die 202 is configured to transmit the read data to silicon converter 242 via electrical signals transmitted along electrical connection 209. Silicon converter 242 converts the electrical signals to optical signals, which are optically transmitted by optical interface 240 via optical fibers 122.

The optical interface 240 may also be configured to receive optical signals that can be converted to electrical signals for transmission to one or more HBM dies 202. The optical interface 240 may be part of a light-bundle optical interconnect. The optical interface 240 may include a plurality of components, optical fiber 122, a frame 224, one or more optical collectors 226, and micro-LEDs 228. Optical interface 240 can be configured to generate optical signals via micro-LEDs 128 and one or more collectors 226 in accordance with a light beam induced current protocol. As provided in FIG. 2, an optical fiber 122 may be attached to the frame 224 of the optical interface 240 so that the optical signal is transmitted over the optical fiber 122. The optical fiber 122 may be a bundled optical fiber that supports a plurality of parallel optical channels 222. The optical fiber 120 may include one or more couplers 229 for transmission of the optical signals into the bundled optical fiber channels 222. A plurality of optical signals may be transmitted to or from HBM assembly 110 over the optical fiber 122. These optical signals may be provided by or to another package, such as processor package 130 of system 101 shown in FIG. 1.

In accordance with aspects of the disclosure, the plurality of HBM assemblies 112A-L can be configured on substrate 119 so that a cooling unit 302, such as a thermal contacting unit, can be used to transfer heat from the memory package 110 in an efficient manner. As shown in diagram 300 of FIG. 3, memory package 110 can be configured so that a cooling unit 302 can be placed over top of the HBM assemblies 112A-L in a manner that allows cooling unit 302 to transfer heat from the components of the high-power region 113 of each HBM assembly 112A-L. For example, cooling unit 302 may include a cold-plate 304 that is configured to extend over, and come into contact with, the high-power components within high-power region 113 of each HBM assembly 112A-L. The cold-plate 304 has a thermally conductive surface, and the heat that is absorbed by cold-plate 304 may be transferred from cooling unit 302 via a cooling liquid that is injected into the cooling unit 302 via inlet 306, and this cooling liquid may be removed from cooling unit 302 via outlet 307. This liquid may travel between inlet 306 and outlet 307 along one or more channels within cooling unit 302, so that the cold-plate 304 evenly absorbs heat from each of HBM assembly 112A-L.

Figure 4:
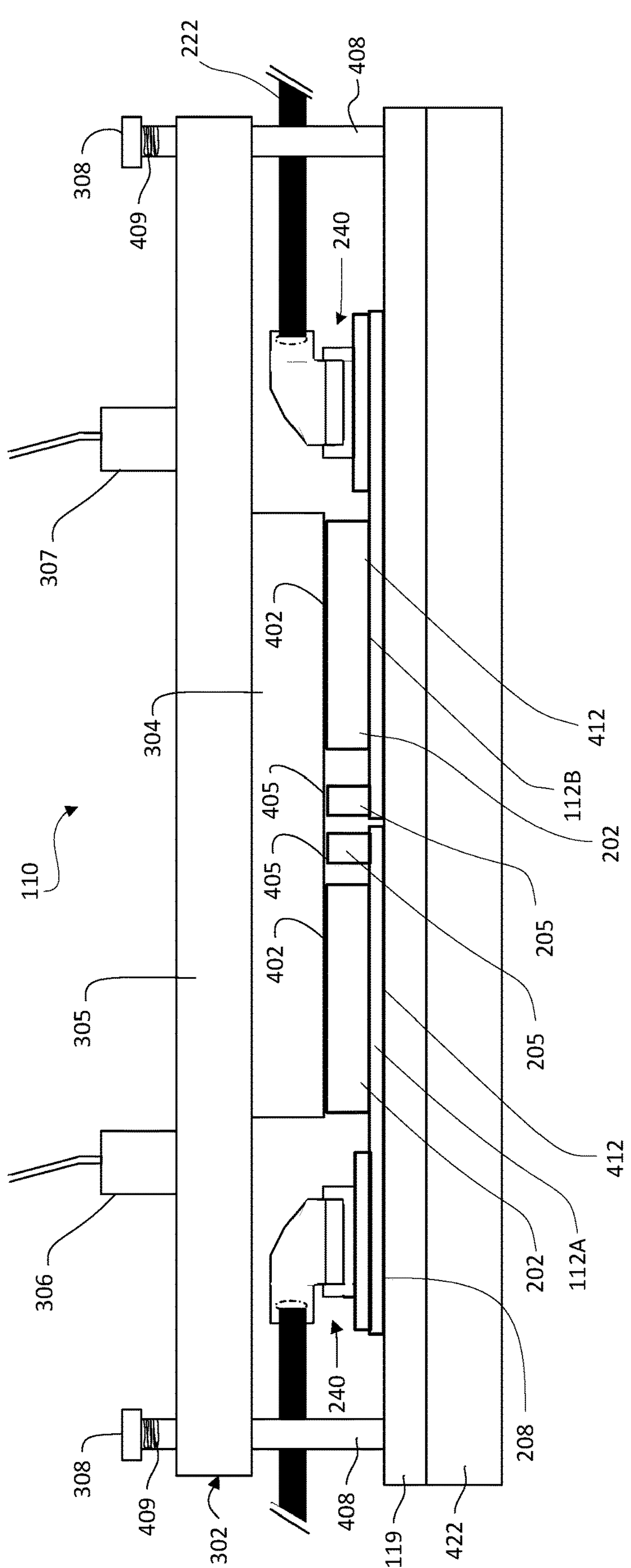
FIG. 4 is a side view of the high-bandwidth memory package having a cooling unit in accordance with aspects of the disclosure.

FIG. 4 is a side view diagram 400 of memory package 110 that includes a cooling unit 302. As discussed above, cold-plate 304 is configured to come into contact with high-power components of each HBM assembly 112A and 112B, such as by contacting the backside 402 of HBM dies 202 as well as the backside 405 of power units 205. Cold-plate 304 may be brought into contact with the high-power components with a compression force in order to increase thermal interface. For example, cooling unit 302 may include load connectors 308 having a shaft 408 that can be screwed into, or otherwise connected to a connecting plate 422, or bolster plate, on which substrate 119 resides. Substrate 119 may include apertures through which shafts 408 of load connectors 308 may extend. Once shafts 408 are connected with connecting plate 422, load connectors 308 may be tightened so as to position cold-plate 304 in a manner so that it provides a compression force via a spring 409 or via some other load bearing mechanism. As shown in diagram 400, cold-plate 304 can be configured so that it does not come into contact with optical interfaces 204, or with any other component located in the low-power region of HBM assemblies 112A and 112B. In addition, substrate 119 may be a motherboard, and signals may be sent between HBM assemblies 112A, 112B and substrate 119 via an interconnect array pad 412, which resides under HBM die 202 on substrate 208, and which can electrically connect with substrate 119.

Figure 3:
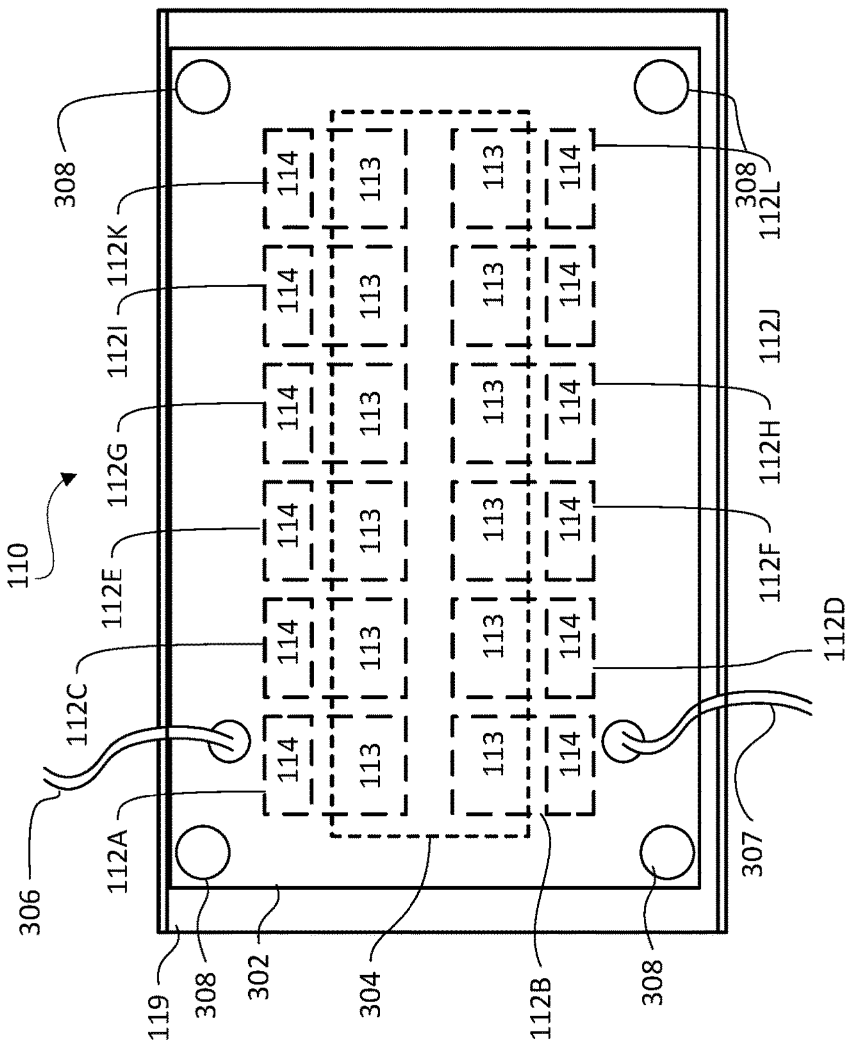
FIG. 3 is a top view of a high-bandwidth memory package having a cooling unit in accordance with aspects of the disclosure.

In accordance with aspects of the disclosure, memory package 110 and processor package 130 may use different forms of cooling from one another. For example, as shown in FIGS. 3 and 4, memory package 110 may be cooled by coming into contact with cold-plate 304, which is itself cooled by a liquid cooling material that is provided by inlet 306 and expelled via outlet 307. In contrast, processor package 130 of FIG. 1 may not require a liquid cooling unit 302, and may instead be cooled via fans or other forms of air cooling. The opposite may also be true, for example, for a small number of HBM assemblies 112, it may be more efficient to use air cooling, while a high-power processor package may be cooled using a liquid cooling unit. For example, if the high-power components of memory package 110 have a power dissipation of around 50 W or more, a liquid cooling unit may be used, while air cooling may be used in other circumstances, such as when the high-power components of the memory package 110 have a power dissipation of less than 30 W. Thus, the current disclosure allows for HBM disaggregation in a manner that provides for flexibility with respect to the different forms of heat transfer that can be used for the separate memory and processor packages.

Figure 5:
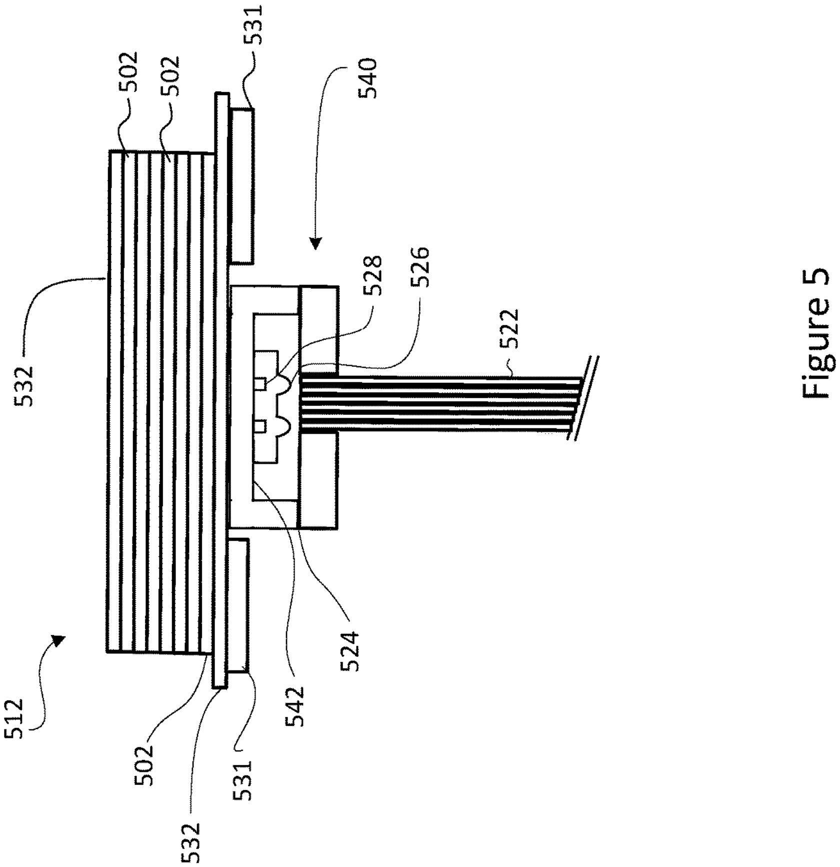
FIG. 5 is a cross-sectional side view of a high-bandwidth memory assembly having a vertically stacked configuration in accordance with aspects of the disclosure.

FIG. 5 is a cross-sectional side view 500 of an HBM assembly 512 that is configured in a vertical stacking configuration. HBM assembly 512 includes a plurality of HBM dies 502 that are vertically stacked on one another. The stacked HBM dies 502 may be connected to a base 532 that allows for HBM assembly 512 to be electronically attached to a board or other substrate via sockets 531 or via other connections, such as a ball grid array. Beneath the stacked HBM dies 502 an optical interface 540 is arranged so as to provide optical fiber channels 522 that extend from beneath the vertical stack of HBM dies 502. The optical interface 540 may include a plurality of components, optical fibers 522, a frame 524, a silicon converter 542, one or more optical collectors 526, and micro-LEDs 528. Optical interface 540 can be configured to generate optical signals via micro-LEDs 528 and one or more collectors in accordance with a light beam induced current protocol. As provided in FIG. 5, optical fiber channels 522 may be attached to frame 524 of the optical interface 540 so that an optical signal can be received or transmitted over the optical fiber channels 522. The optical fiber channels 522 may be a bundled optical fiber that supports a plurality of parallel optical channels. A plurality of optical signals may be transmitted to or from HBM assembly 512 over the optical fiber channels 522. These optical signals may be provided by or received by another package, such as a processor package, that is remotely located from HBM assembly 512, but which is optically connected to one or more fiber channels 522.

Figure 6:
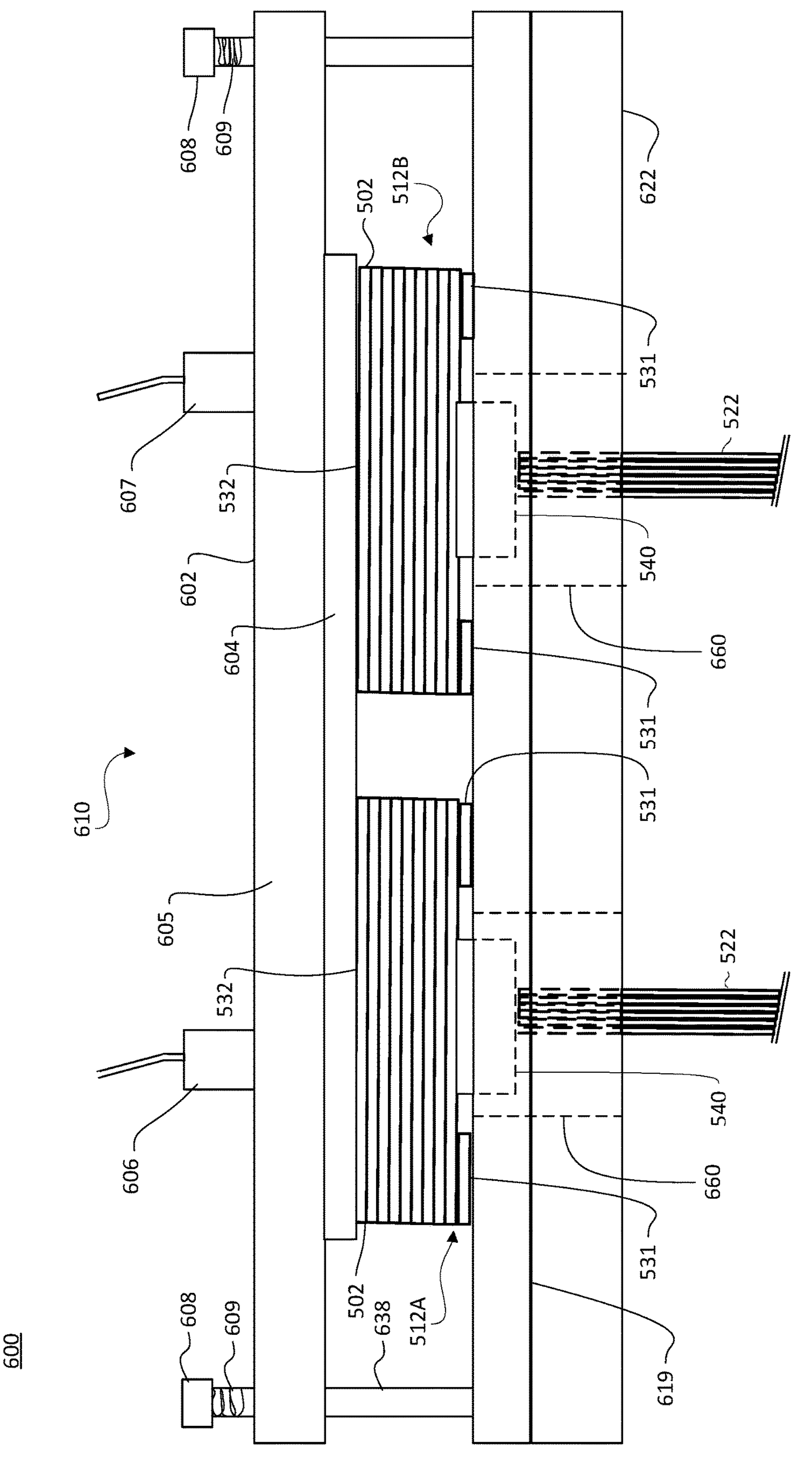
FIG. 6 is a side view of a high-bandwidth memory package with high-bandwidth memory assemblies having a vertically stacked configuration in accordance with aspects of the disclosure.

One or more HBM assemblies 512 can be incorporated into a memory package that contains one or more cooling components configured to transfer heat from the high-power dissipation components of HBM assembly 512. For example, FIG. 6 is a side view diagram 600 of memory package 610 that includes a cooling unit 602 having a cold-plate 604 that is configured to transfer heat from a high-power dissipation region of HBM assembly 512. Cold-plate 604 of side view diagram 600 is configured to come into contact with high-power components of HBM assemblies 512A and 512B, such as by contacting the exposed backside 532 of the stack of HBM dies 502. Cold-plate 604 may be brought into contact with the high-power components with a compression force in order to increase thermal interface. For example, cooling unit 602 may include load connectors 608 having a shaft 638 that can be screwed into, or otherwise connected to a connecting plate 622 on which substrate 619 resides. Substrate 619 may include apertures through which shafts 638 of load connectors 608 may extend. Once shafts 638 are connected with connecting plate 622, load connectors 608 may be tightened so as to position cold-plate 604 in a manner so that it provides a compression force via a spring 609 or via some other load bearing mechanism.

As shown in diagram 600, HBM assemblies 512A and 512B are configured so that cold-plate 604 does not come into contact with optical interfaces 540, which are located in a low-power region on the opposing side of HBM assemblies 112A and 112B. In addition, substrate 619 may be a motherboard, and may be connected to HBM assemblies 512A, 512B via sockets 531 which reside on the underside of HBM assemblies 512A, 512B.

Figure 7:
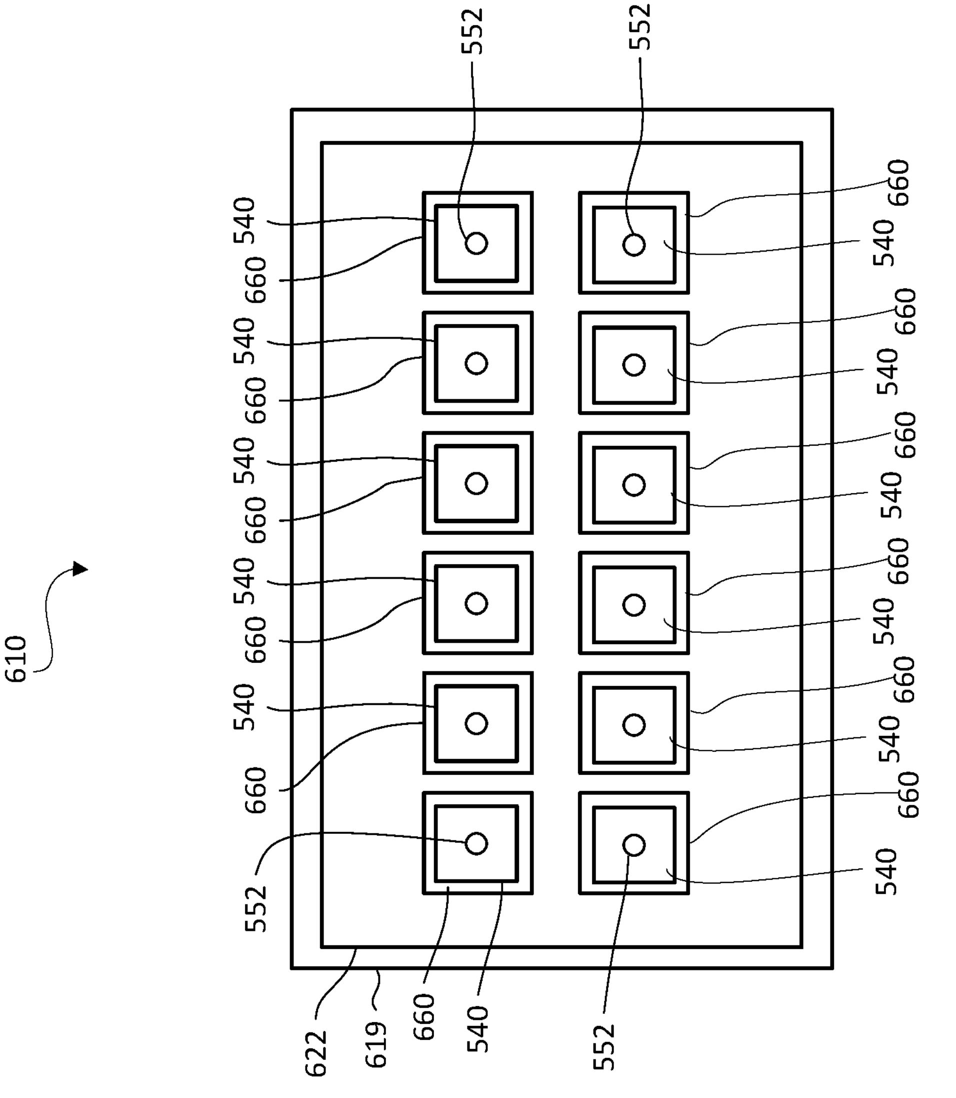
FIG. 7 is a bottom view of the high-bandwidth memory package in accordance with aspects of the disclosure.

Substrate 619 and connecting plate 622 may each be configured so as to provide for a plurality of apertures 660, through which the optical interface 540 and optical fiber channels 522 may extend. For example, FIG. 7 is a bottom view 700 of memory package 610 in which a plurality of apertures 660 are provided through substrate 619 and connecting plate 622 through which optical interfaces 540 and optical fiber 552 may extend. While not shown in bottom view 700, the plurality of optical fibers 552 from each optical interface 540 may be bundled together and may extend to a processor package that is remotely located from memory package 610.

In accordance with aspects of the disclosure, memory package 610 and may use a different form of cooling from a processor package with which it is optically connected. For example, as shown in FIG. 6, memory package 610 may be cooled by coming into contact with cold-plate 604, which is itself cooled by a liquid cooling material that is provided by inlet 606 and expelled via outlet 607. In contrast, an optically connected processor package may not require a liquid cooling unit, and may instead be cooled via fans or other forms of air cooling. The opposite may also be true, for example, for a small number of HBM assemblies 512, it may be more efficient to use air cooling, while a high-power processor package may be cooled using a liquid cooling unit.

Figure 8:
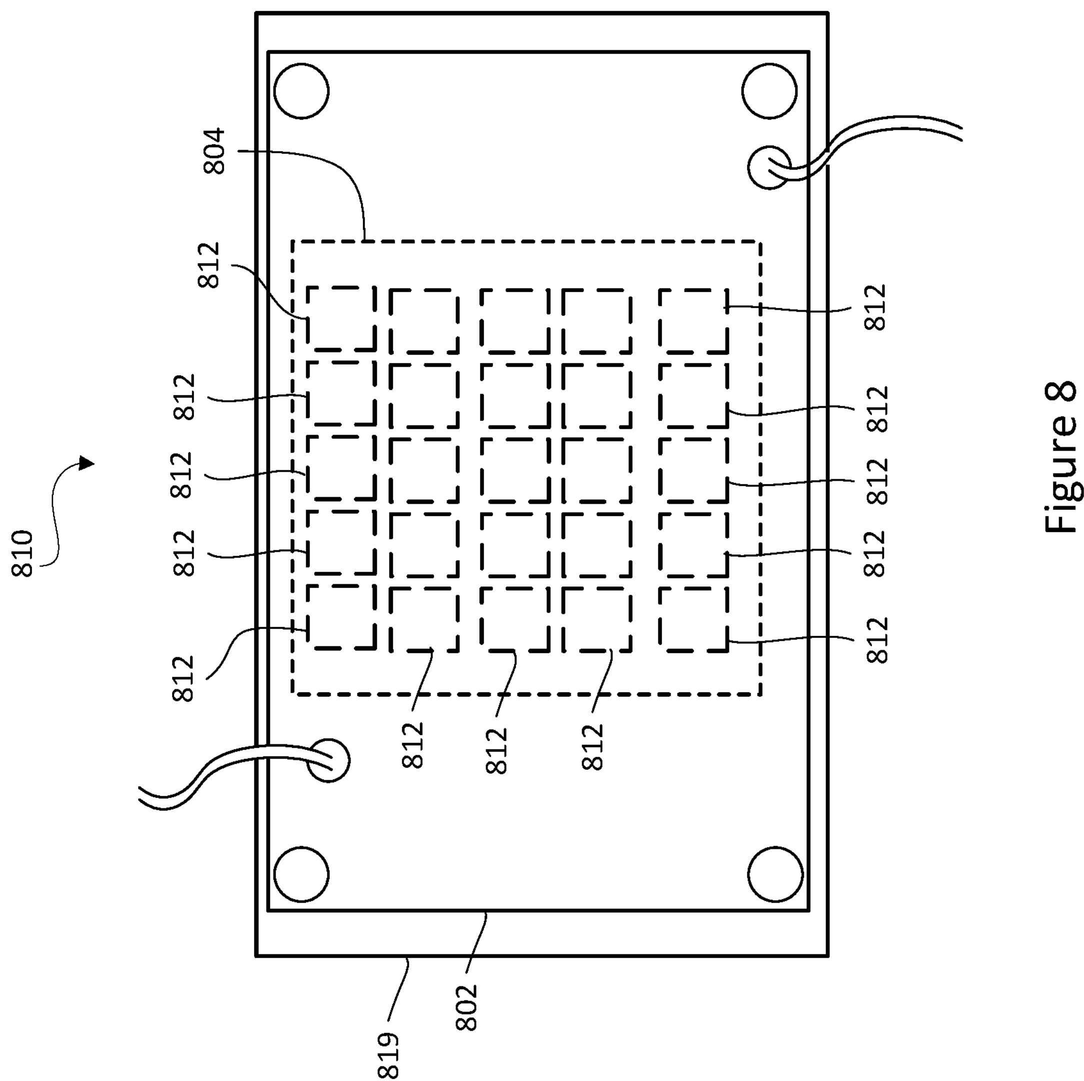
FIG. 8 is a top view of a high-bandwidth memory package having an array of high-bandwidth memory assemblies in accordance with aspects of the disclosure.

FIGS. 1, 3, and 7 show memory packages having a two-by-eight array of HBM assemblies, in that the HBM assemblies are arranged into two rows with each row having eight HBM assemblies. As shown in FIGS. 3 and 4, the array of HBM assemblies 112A-L can be configured in such a manner as to allow for a single cold-plate 304 to contact high-power regions 113 of each HBM assembly 112A-L, without the cold-plate 304 contacting the components of the low-power regions 114, such as the optical interface 240. In addition, the HBM package may be configured to have a different number of HBM assemblies and/or the HBM assemblies may be arranged in a different configuration. For example, FIG. 8 is a top-view diagram 800 of a memory package 810 having a high-density five-by-five array of stacked HBM assemblies 812. Memory package 810 includes a cooling unit 802 with a cold-plate 804 that is liquid cooled in accordance with the disclosure herein. Cold-plate 804 may be configured so that it is brought into contact with an HBM die stack for each of the HBM assemblies 812, with the optical interface and optical fibers (not shown) for each HBM assembly extending from the opposing bottom side of memory package 810.

Figure 9:
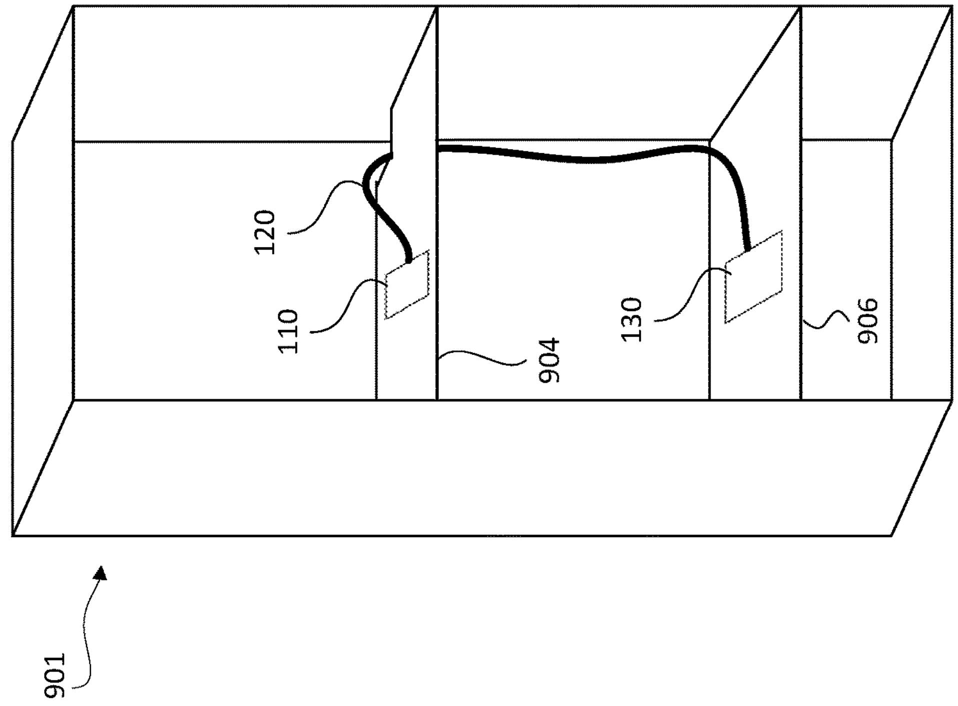
FIG. 9 is a diagram of a server rack having a high-bandwidth memory package and a processor package in accordance with aspects of the disclosure.

Returning to FIG. 1, memory package 110 and processor package 130 may be arranged as separate packages that share a common circuit board or are otherwise located in the same device, such as being located within a common server. However, memory package 110 and processor package 130 may also be located in separate devices. For example, FIG. 9 is a diagram 900 of a server rack 901, which contains a plurality of trays 904, 906. As shown in diagram 900, memory package 110 may be provided within a first tray 904 of server rack 901, while processor package 130 may be located within a second tray 906 of server rack 901. As disclosed herein, memory package 110 and processor package 130 are optically connected to one another via an optical bundle 120. Accordingly, memory package 110 and processor package 130 may optically communicate with one another in order to perform processing functions, such as processors within the processor package 130 controlling read and write operations that are to be performed by HBM assemblies contained in memory package 110. In addition, memory package 110 and processor package 130 may be cooled using different cooling mediums. For example, memory package 110 may include a liquid cooling medium, while processor package 110 is air cooled.

Figure 10:
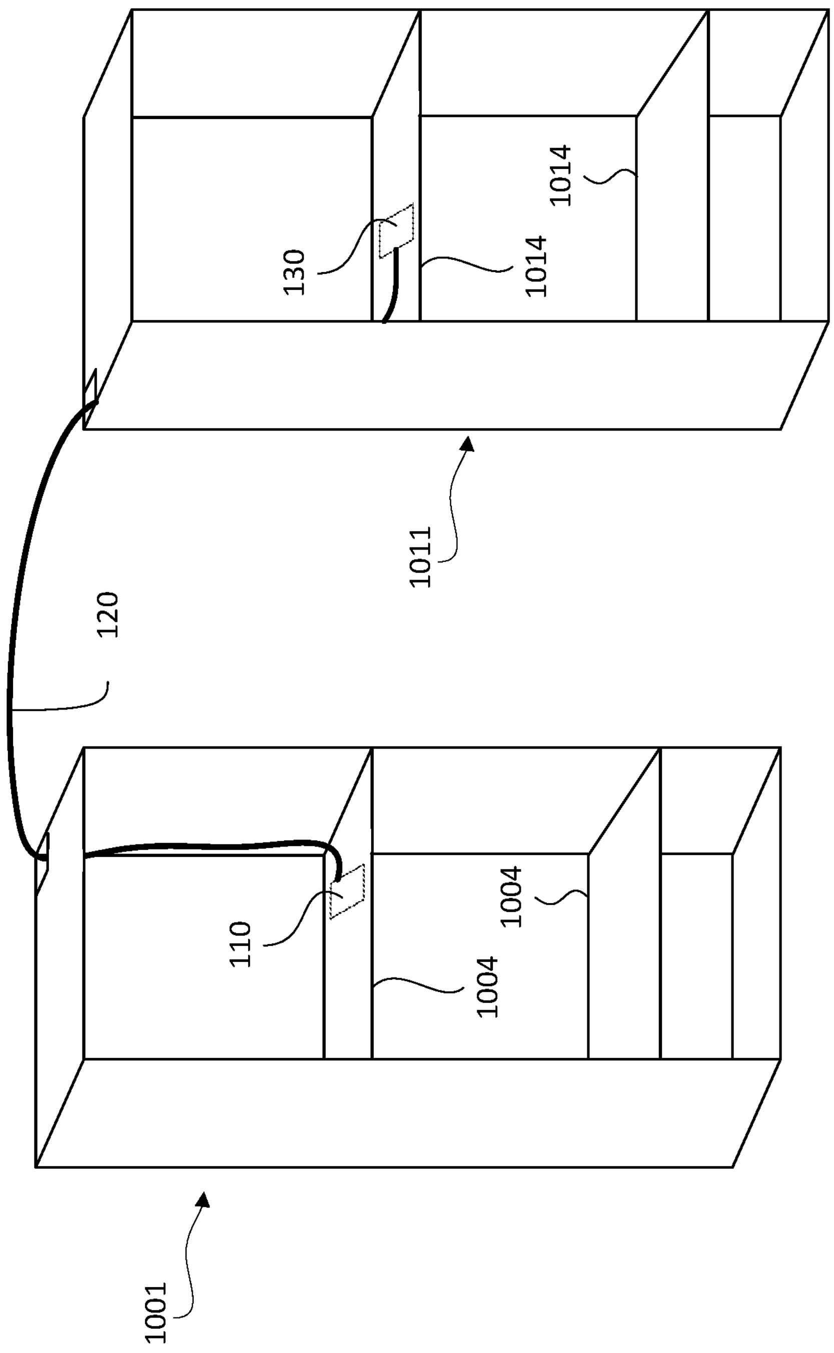
FIG. 10 is a diagram of two server racks having a high-bandwidth memory package and a processor package in accordance with aspects of the disclosure.

In addition, memory package 110 and processor package 130 may be located within different server racks. For example, FIG. 10 is a diagram 1000 of a first server rack 1001 having a plurality of trays 1004 and a second server rack 1011 having a plurality of trays 1014. Memory package 110 is located within a tray 1004 of server rack 1001, while processor package 130 is located within a tray 1014 of server rack 1011. An optical bundle 120 may be arranged to run from memory package 110 to processor package 130, so as to optically connect the two packages. In addition, memory package 110 and processor package 130 may be cooled using different cooling mediums. For example, memory package 110 may include a liquid cooling medium, while processor package 110 is air cooled.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples. Further, the same reference numbers in different drawings can identify the same or similar elements.

The invention claimed is:

1. A system comprising:

a processor package comprising one or more processing units; and a high-bandwidth memory (HBM) package comprising a plurality of HBM assemblies and one or more cooling components, wherein each HBM assembly has a first region containing a first set of components and a second region containing a second set of components, wherein the first set of components are higher power components with respect to the second set of components and the second set of components includes an optical interface configured to communicate via one or more optical fibers with the processor package, and wherein the one or more cooling components are configured to transfer heat from the first set of components of the plurality of HBM assemblies.

2. The system of claim 1, wherein the one or more cooling components includes a cold-plate that is configured to contact the first set of components of the plurality of HBM assemblies.

3. The system of claim 2, wherein the cold-plate does not contact the second set of components of the plurality of HBM assemblies.

4. The system of claim 1, wherein the processor package further comprises a cooling unit that is distinct from the one or more cooling components of the HBM package.

5. The system of claim 4, wherein the cooling unit is configured to use a different type of medium for transferring heat than the one or more cooling components of the HBM package.

6. The system of claim 1, wherein the first set of components includes one or more HBM dies.

7. The system of claim 1, wherein each of the plurality of HBM assemblies has a footprint within the HBM assembly and wherein the first region corresponds to a first portion of the footprint and the second region corresponds to a second portion of the footprint.

8. The system of claim 1, wherein the plurality of HBM assemblies have a first side and a second side that opposes the first side, and wherein the first set of components comprise a stack of HBM dies located at the first side of each HBM assembly and the optical interface is located at the second side of each HBM assembly.

9. The system of claim 1, wherein the plurality of HBM assemblies are arranged to be in an array of at least two rows.

10. The system of claim 1, wherein the plurality of HBM assemblies are arranged to be in an array having more than two rows.

11. A system comprising:

a processor package comprising one or more processors;

a memory package comprising a plurality of HBM assemblies, wherein each HBM assembly comprises an HBM die and an optical interface;

a thermal contact unit having one or more thermally conductive surfaces, wherein the HBM die of each HBM assembly is configured to contact at least one of the thermally conductive surfaces, and wherein the optical interface of each HBM assembly does not contact the one or more surfaces; and one or more optical fibers configured to optically connect the optical interface with one or more processing units.

12. The system of claim 11, wherein the one or more surfaces of the thermal contact unit are defined by a cold-plate that is configured to contact each HBM die.

13. The system of claim 11, wherein the thermal contact unit is configured to apply a compression force between the one or more surfaces and the plurality of HBM assemblies.

14. The system of claim 13, wherein the thermal contact unit applies the compression force via one or more spring-loaded connectors.

15. The system of claim 14, further comprising:

a substrate on which the plurality of HBM assemblies are arranged; and a connecting plate that is configured to connect with the one or more spring-loaded connectors, wherein the plurality of HBM assemblies are arranged on a first side of the substrate and the connecting plate is located on a second side of the substrate that opposes the first side.

16. The system of claim 11, wherein the processor package further comprises a cooling unit that is distinct from the thermal contact unit of the HBM package.

17. The system of claim 16, wherein the cooling unit is configured to use a different type of medium for transferring heat than the thermal contact unit.

18. The system of claim 11, wherein the plurality of HBM assemblies have a first side and a second side that opposes the first side, and wherein the HBM die is located at the first side of each HBM assembly and the optical interface is located at the second side of each HBM assembly.

19. The system of claim 11, wherein the plurality of HBM assemblies are arranged to be in an array of at least two rows.

20. The system of claim 11, wherein the plurality of HBM assemblies are arranged to be in an array having more than two rows.

* * * * *